(12) United States Patent
Aihara

(10) Patent No.: US 7,241,150 B2
(45) Date of Patent: Jul. 10, 2007

(54) CONNECTOR, A TERMINAL FITTING, A CHAINED TERMINAL AND A MOUNTING METHOD FOR A CONNECTOR

(75) Inventor: Tetsuya Aihara, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 11/504,323

(22) Filed: Aug. 15, 2006

(65) Prior Publication Data

US 2007/0042618 A1    Feb. 22, 2007

(30) Foreign Application Priority Data

Aug. 18, 2005  (JP) ............................. 2005-237310
Sep. 14, 2005  (JP) ............................. 2005-266747

(51) Int. Cl.
*H01R 12/00* (2006.01)
(52) U.S. Cl. .................... 439/83; 439/910; 439/885
(58) Field of Classification Search .................. 439/83, 439/885, 910, 874–876
See application file for complete search history.

(56) References Cited

U.S. PATENT DOCUMENTS

| | | | |
|---|---|---|---|
| 4,737,115 A | 4/1988 | Seidler | |
| 5,241,134 A | 8/1993 | Yoo | |
| 5,725,400 A * | 3/1998 | Morikawa et al. | 439/874 |
| 5,823,801 A | 10/1998 | Elkhatib | |
| 6,354,871 B1 | 3/2002 | Hatakeyama | |
| 2003/0034169 A1 | 2/2003 | Tanaka | |
| 2003/0134530 A1* | 7/2003 | Yu-Feng | 439/83 |
| 2004/0121632 A1* | 6/2004 | Takata | 439/83 |

FOREIGN PATENT DOCUMENTS

DE    199 07 427 A1    9/1999

* cited by examiner

*Primary Examiner*—Ross N. Gushi
(74) *Attorney, Agent, or Firm*—Gerald E. Hespos; Anthony J. Casella

(57) ABSTRACT

A circuit board connector has a housing 10 and terminal fittings (30) mounted in the housing (10). The terminal fittings (30) have board connecting portions (34) drawn out of the housing (10). The board connecting portions (34) are arranged on the surface of a circuit board (K) and connected with conductors on the circuit board (K) by soldering. Notches (36) are formed in lateral edges (37) of the board connecting portions (34) and have upward-sloped surfaces (39) to which solder (H) applied to the conductors adheres. A solder test is conducted by observing from above the adhered state of the solder (H) to the sloped surfaces (39) of the notches (36).

16 Claims, 10 Drawing Sheets

CONNECTOR, A TERMINAL FITTING, A CHAINED TERMINAL AND A MOUNTING METHOD FOR A CONNECTOR

BACKGROUND OF THE INVENTION

1. Field of the Invention

The invention relates to a connector for an electric or electronic device, in particular to a circuit board connector, to a terminal fitting therefor, to chained terminals and to a method of mounting a connector to an electric or electronic device such as a printed circuit board.

2. Description of the Related Art

U.S. Pat. No. 6,354,871 discloses a circuit board connector that comprises a housing to be fixed to a circuit board and terminal fittings that are pressed into the housing. A terminal connecting portion is defined at one end of each terminal fitting and projects into the housing for electrical connection with a mating terminal. A board connecting portion is defined at the opposite end of each terminal fitting and is drawn out of the housing for soldered connection with a conductor on the outer surface of the circuit board.

Solder adhered to parts of the board connecting portions forward of the rear end surfaces generally are hidden by the adjacent terminal fittings and/or by the housing. As a result, the adequacy of the solder connection of the board connecting portions typically is tested visually by looking at the height of solder adhered to the extending rear end surfaces of the board connecting portions.

Plating, such as tin plating, is applied to the outer surfaces of the terminal fittings to improve contact reliability of the terminal connecting portions with the mating terminal fittings. Plating also improves the affinity of solder at the board connecting portions to enable satisfactory soldering.

FIG. 7(A) shows terminal fittings produced by punching an electrically conductive metal sheet to obtain chained terminals 1. The chained terminals 1 have a long carrier 3 and terminal fittings 4 project side by side from one lateral edge of the carrier 3. Couplings 5 join the terminal fittings 4 to the carrier 3, and board connecting portions 6 are adjacent to the couplings 5. Rear end surfaces of the board connecting portions 6 define the solder testing areas and are exposed. The plating applied to the chained terminals 1 desirably forms metal films on the exposed solder testing surfaces at rear ends of the board connecting portions 6, and hence makes the solder test more reliable.

The couplings 5 must be between the board connecting portions 6 of the above-described chained terminals 1, and accordingly intervals between the terminal fittings 4 is wide. An attempt could be made to narrow the intervals between the terminal fittings 4, as shown in FIG. 7(B). However, this requires narrower and weaker couplings 5 that can be difficult to press work. As a result, intervals between the terminal fittings 4 are not narrowed easily, thereby complicating further miniaturization and leading to a higher cost.

Moreover, solder applied to the conductors adheres only to lower surfaces and opposite side surfaces of the board connecting portions of the above-described terminal fittings. Thus, forces on the board connecting portions in a direction away from the circuit board can detach the board connecting portions from the conductors, thereby impairing connection reliability.

The present invention was developed in view of the above problems, and an object thereof is to improve overall operability of a connector to be mounted to an electric or electronic device such as a printed circuit board.

SUMMARY OF THE INVENTION

The invention relates to a connector for an electric or electronic device such as a printed circuit board. The connector comprises a housing to be fixed to an electric or electronic device, and terminal fittings to be mounted in the housing. Each terminal fitting has a device connecting portion to be drawn out of the housing. The lower surface of the device connecting portion is to be arranged on the electric or electronic device and is connected with a corresponding conductor on the device by soldering. One or more recesses are formed in the device connecting portions for guiding the flow of solder applied to the conductors therein.

The recesses preferably comprise solder testing portions at lateral edges of the device connecting portions. The solder testing portions have upward slopes and solder applied to the conductors adheres to the slopes. The height of the upper surface of the solder is to be defined within a height range of the slopes, and an adhered state of the solder to the slopes can be seen from the outside.

Miniaturization and lower cost of the terminal fittings is realized by enabling an operation of punching out terminal fittings spaced apart at narrower intervals thereby improving overall efficiency of the connector.

A test may be conducted to determine whether the solder connection at the board connecting portions is satisfactory. The test is conducted by detecting the adhered state of the solder to the sloped surfaces of the solder testing portions at the lateral edges of the device connecting portions. The solder test does not rely on the extending end surfaces of the device connecting portions. Thus, there is no need to plate the extending end surfaces of the device connecting portions. Testing is not hindered even though the device connecting portions also couple the terminal fittings to the carrier and are cut after plating is applied to leave the extending end surfaces of the device connecting portions unplated. Therefore, there is no need to provide couplings between adjacent device connecting portions. As a result, the terminal fittings can be punched at narrower intervals to achieve miniaturization and lower cost.

The solder testing portions preferably are formed by making oblique cuts in the lateral edges of the device connecting portions, and the inner surfaces of the cuts define the sloped surfaces. The oblique cuts can be formed efficiently by striking the lateral edges of the device connecting portions obliquely from above. Further, the adhered state of the solder to the inner sloped surfaces of the cuts can be seen and graphed precisely.

The bottom edges of the sloped surfaces in the solder testing portions preferably are at the lower surfaces of the device connecting portions. Thus, a contact area of the sloped surfaces and the solder is large, and the board connecting portions can be fixed securely to the circuit board. Further, solder does not adhere to the bottom edges of the sloped surfaces unless plating is applied. Thus, judgment can be made as to whether plating has been already applied.

The sloped surfaces of the recesses may be colored in a color that has a clear contrast with the solder.

The recesses preferably are formed by striking a corner of the device connecting portions obliquely from a side.

The sloped surfaces of the recesses preferably are substantially symmetric with respect to forward and backward directions.

Each recess preferably is formed with a cut-in line that extends obliquely to a normal vector of the surface of the circuit board and slopes up along directions away from the cut-in line.

The recesses preferably are on surfaces of the device connecting portion substantially opposite the surface that will face the electric or electronic device. Thus, solder that flows into the recesses resists upward tensile forces on the device connecting portions and prevents detachments of the device connecting portions form the conductors. Accordingly, connection reliability between device connecting portions and conductors is improved.

The recesses preferably extend across the upper surfaces of the device connecting portions and make openings in side surfaces at substantially opposite sides of the upper surfaces. Thus, solder that flows into the recesses extends between the opposite side surfaces of the device connecting portions to form bridges. Accordingly, the device connecting portions are held onto the electric or electronic device with enhanced force.

The invention also relates to the above-described terminal fitting independent of the housing.

The invention further relates to chained terminals comprising a carrier and the above-described terminal fittings that project substantially side by side from at least one lateral edge of the carrier.

The invention also relates to a method of mounting a connector to an electric or electronic device such as a printed circuit board. The method comprises providing a housing to be fixed to the device and mounting one or more terminal fittings in the housing so that a device connecting portion of the terminal fitting is drawn out of the housing. The method continues by arranging the device connecting portion along a surface of the device and connecting the device connecting portion with a corresponding conductor on the device by soldering thereby at least partly applying solder to recesses of the device connecting portion.

The connecting step preferably includes applying solder to one or more solder sloped surfaces of recesses at lateral edges of the device connecting portions.

The method may further comprise inspecting an adhered state of the solder to the sloped surface of the recess.

These and other objects, features and advantages of the present invention will become more apparent upon reading of the following detailed description of preferred embodiments and accompanying drawings. It should be understood that even though embodiments are separately described, single features thereof may be combined to additional embodiments.

DETAILED DESCRIPTION OF THE PREFERRED EMBODIMENTS

A circuit board connector according to a first embodiment of the invention is illustrated in FIGS. 1 to 6. The connector has a housing 10 that is made e.g. of a synthetic resin. The housing 10 is mountable to a circuit board K and is connectable with an unillustrated mating housing. In the following description, an end to be connected with the mating housing is referred to as the front concerning forward and backward directions FBD, and reference is made to FIGS. 1 to 3 concerning the vertical direction VD.

Figure 1:
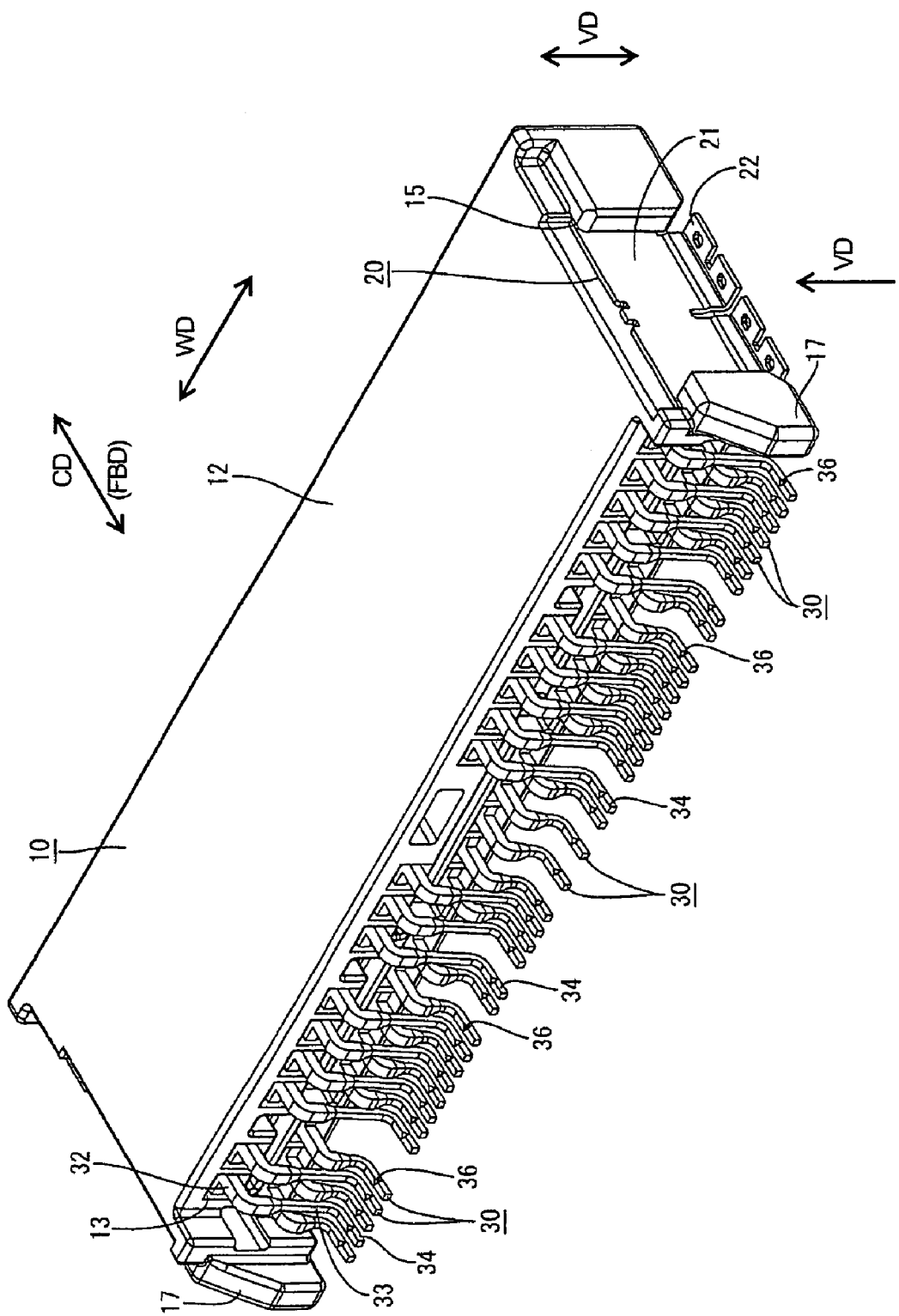
FIG. 1 is a perspective view of a circuit board connector according to one preferred embodiment.
Figure 2:
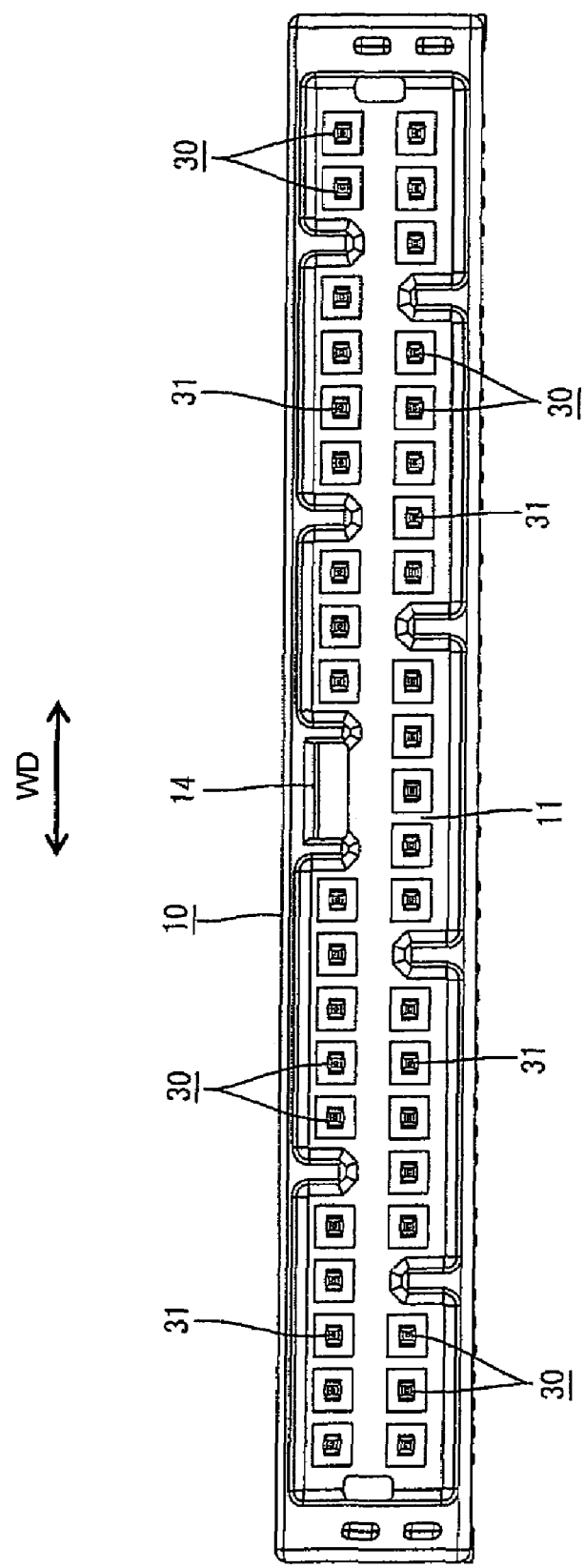
FIG. 2 is a front view of the circuit board connector.

The housing 10 has a wide terminal holding portion 11 and a receptacle 12 projects from the periphery of the terminal holding portion 11, as shown in FIGS. 1 and 2. The terminal holding portion 11 has terminal insertion holes 13, and terminal fittings 30 are insertable into the terminal insertion holes 13 from behind and along an insertion direction. The terminal insertion holes 13 are arranged substantially side by side in a width direction WD at upper and lower stages.

The receptacle 12 is a substantially rectangular tube with an open front end, and can fit with a mating housing from the front and along a connecting direction CD. A lock 14 projects down and in at a substantially widthwise middle position of the upper part of the receptacle 12 and is engageable with a lock arm of the mating housing.

Figure 3:
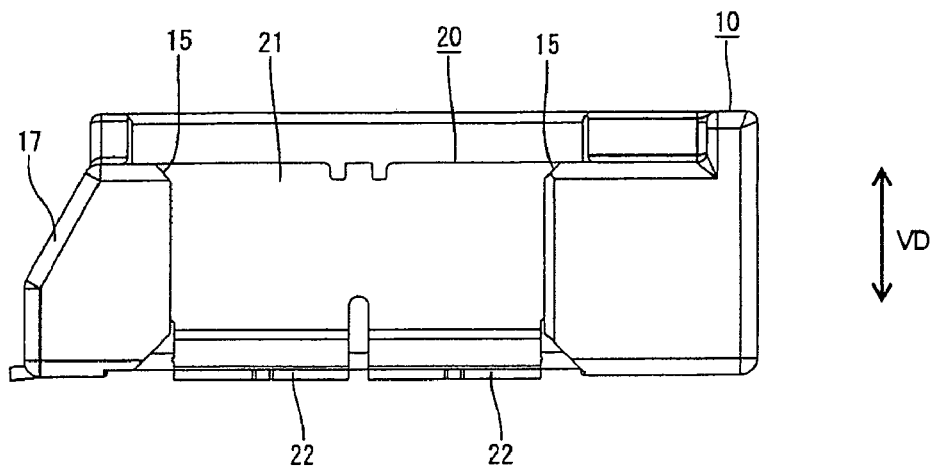
FIG. 3 is a side view of the circuit board connector.

Two mounting grooves 15 are provided at the opposite widthwise ends of the receptacle 12 and receive fixing members 20 for fixing the housing 10 to the circuit board K. Each fixing member 20 is made of a metal plate separate from the housing 10 and is bent into an L-shape to define a substantially planar main portion 21 and a solder portion 22 that extends substantially perpendicularly from the bottom end of the main portion 21. The main portion 21 is aligned substantially in the vertical direction VD and. is inserted along a mounting direction MD into the mounting groove 15 as shown in FIG. 3. Thus, the solder portion 22 extends substantially in the width direction WD and can be fixed by soldering to a surface of the circuit board K.

Each terminal fitting 30 is formed by bending a rectangular bar made of a conductive metal and has a terminal connecting portion 31 that projects forward from the terminal holding portion 11. The terminal connecting portions 31 are surrounded by the receptacle 12 and are electrically connectable with mating terminals in the mating housing. A substantially horizontal portion 32 projects back from the rear of the terminal holding portion 11 and is aligned substantially parallel to the surface of the circuit board K. A vertical portion 33 extends substantially perpendicularly down from the rear end of the horizontal portion 32 and is substantially normal to the surface of the circuit board K. A board connecting portion 34 is bent to extend substantially horizontally back from the bottom end of the vertical portion 33 and hence is substantially parallel to the surface of the circuit board K. The horizontal portions 32, the vertical portions 33 and the board connecting portions 34 are exposed outside the housing 10. Additionally, the board connecting portions 34 are arranged along the surface of the circuit board K and can be soldered with conductor paths printed or otherwise provided on the circuit board K.

Parts of the upper stage terminal fittings 30 exposed at the rear of the housing 10 are offset in the width direction WD from corresponding parts of the lower stage terminal fittings 30. Additionally, rear ends of the board connecting portions 34 at the upper and lower stages are at substantially the same position with respect to forward and backward directions FBD. On the other hand, the terminal connecting portions 31 of the upper and lower stage terminal fittings 30 are at substantially the same positions in the width direction WD. Thus, the terminal connecting portions 31 and the horizontal portions 32 are offset in the width direction WD at boundary portions 35 therebetween (see FIG. 6). Further, protection walls 17 project back from opposite sides of the receptacle 12 to protect the horizontal portions 32, the vertical portions 33 and the board connecting portions 34 from interference in the width direction WD.

Figure 4:
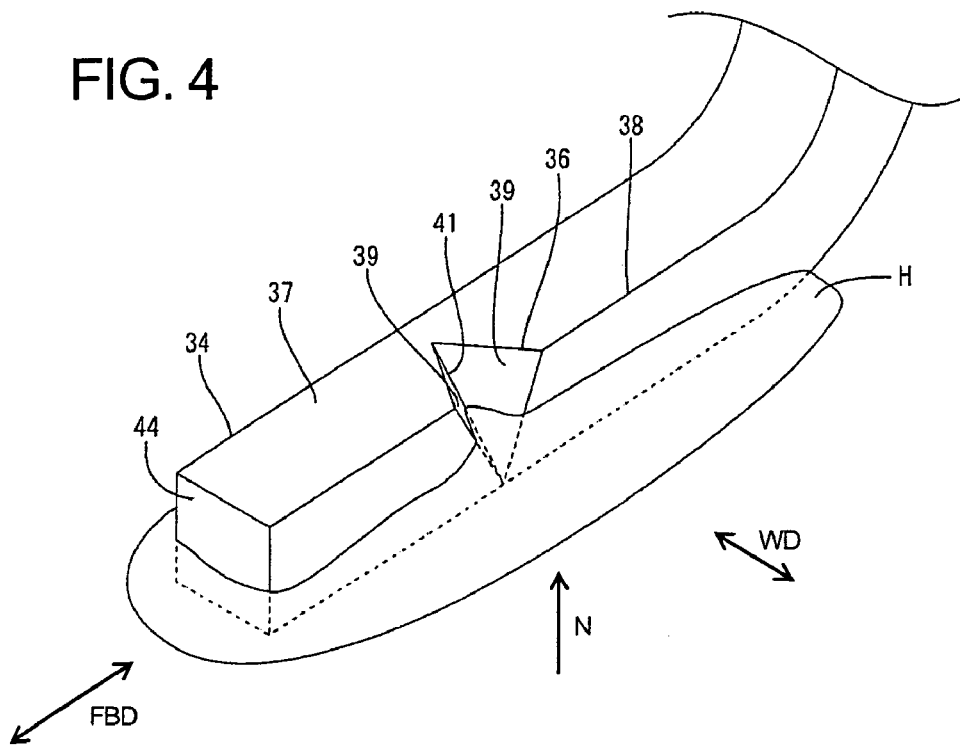
FIG. 4 is an enlarged perspective view of a board connecting portion having solder adhered thereto.

A notch 36 is formed by striking a corner 38 of the board connecting portion 34 obliquely from the top. The notch 36 is widest at the corner 38 and intersects the top surface 37 and one side surface of the board connecting portion 34 in substantially V-shapes, as shown in FIG. 4. Additionally, the notch 36 has a depth so that the apex of the V-shape on the side surface of the board connecting portion 34 is substantially adjacent the bottom surface of the board connecting portion 34. Thus, the notch 36 will reach substantially to the surface of the printed circuit board K.

The notch 36 includes slanted surfaces 39 that meet at a cut-in line 41. The cut-in line 41 is oblique to the vertical direction VD and hence oblique to the normal vector N from the surface of the circuit board K. Additionally, normal vectors from the slanted surfaces 39 intersect the normal vector N of the circuit board K at an angle that preferably is in the range of about 20° to 60°. The notches 36 extend over a width that is more than about one third, and preferably more than about one half of the width of the board connecting portion 34. The notches 36 of all of the board connecting portions 34 are substantially identical, and are at substantially the same positions along the respective board connecting portions 34 with respect to forward and backward directions FBD. Molten solder H will flow up into the notches 36 and will adhere to the slanted surfaces 39 when the board connecting portions 34 are being soldered to the circuit board K. The adhered state of the solder H can be seen from the outside so that the notches 36 function as solder testing portions.

Figure 6:
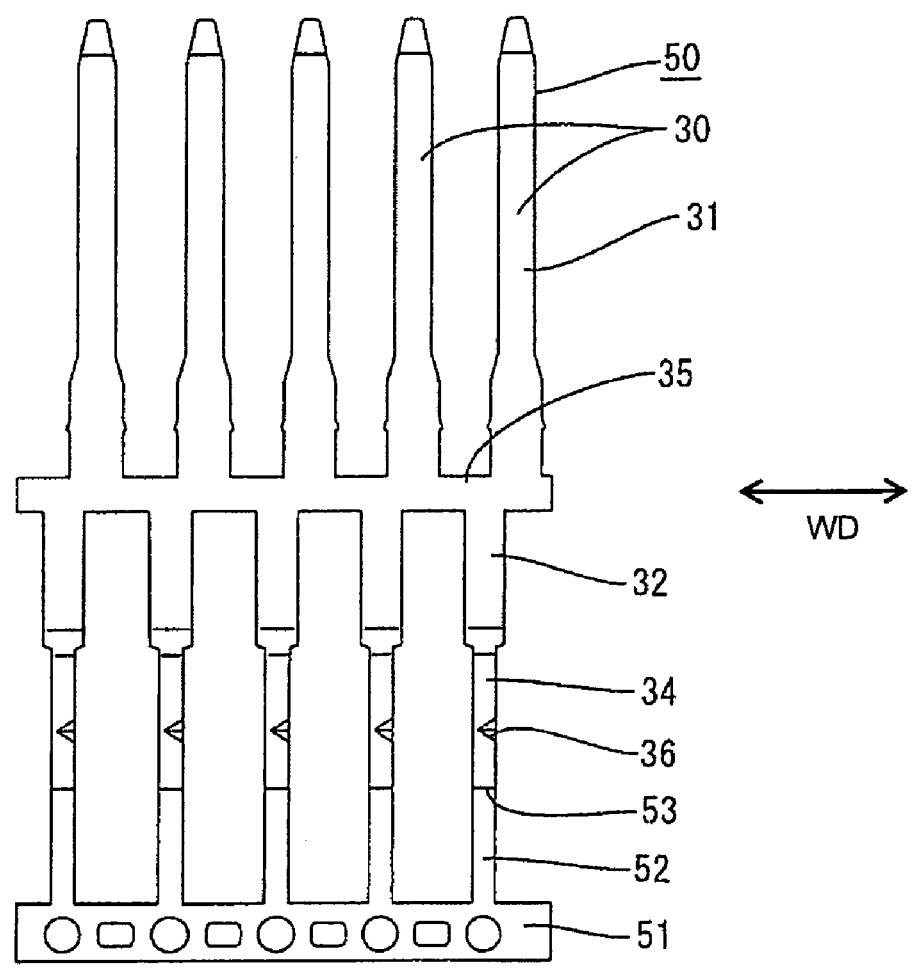
FIG. 6 is a plan view of chained terminals.

The terminal fittings 30 are formed from chained terminals 50. As shown in FIG. 6, the chained terminals 50 have a carrier 51 that extends in the width direction WD of the terminal fittings 30, and the terminal fittings 30 project substantially side by side from one lateral edge of the carrier 51. The terminal fittings 30 are joined to the carrier 51 by couplings 52 that later become parts of the board connecting portions 34. The terminal fittings 30 are cut from the carrier 51 at cutting lines 53 located at longitudinal intermediate positions of the couplings 52. The board connecting portions 34 are formed as being cut off from the carrier 51, and rear surfaces 44 of the board connecting portions 34 are exposed as cut surfaces.

A preferred manufacturing process involves punching and/or stamping a conductive metal sheet to form the chained terminals 50 shown in FIG. 6, including the notches 36. Plating, such as tin, silver, gold or the like, then is applied to the chained terminals 50, for example, by immersing the chained terminals 50 in plating solution and/or by galvanic deposition. The couplings 52 then are cut along the cutting lines 53 to separate the terminal fittings 30 from the carrier 51. As a result, the rear end surfaces 44 of the board connecting portions 34 are unplated cut surfaces. However, all other outer surfaces of the terminal fittings 30 are plated. It should be understood that the plating and cutting steps may be inversed, if desired. The respective terminal fittings 30 then are inserted into the terminal insertion holes 13 of the housing 10 from behind and along the inserting direction.

Figure 5:
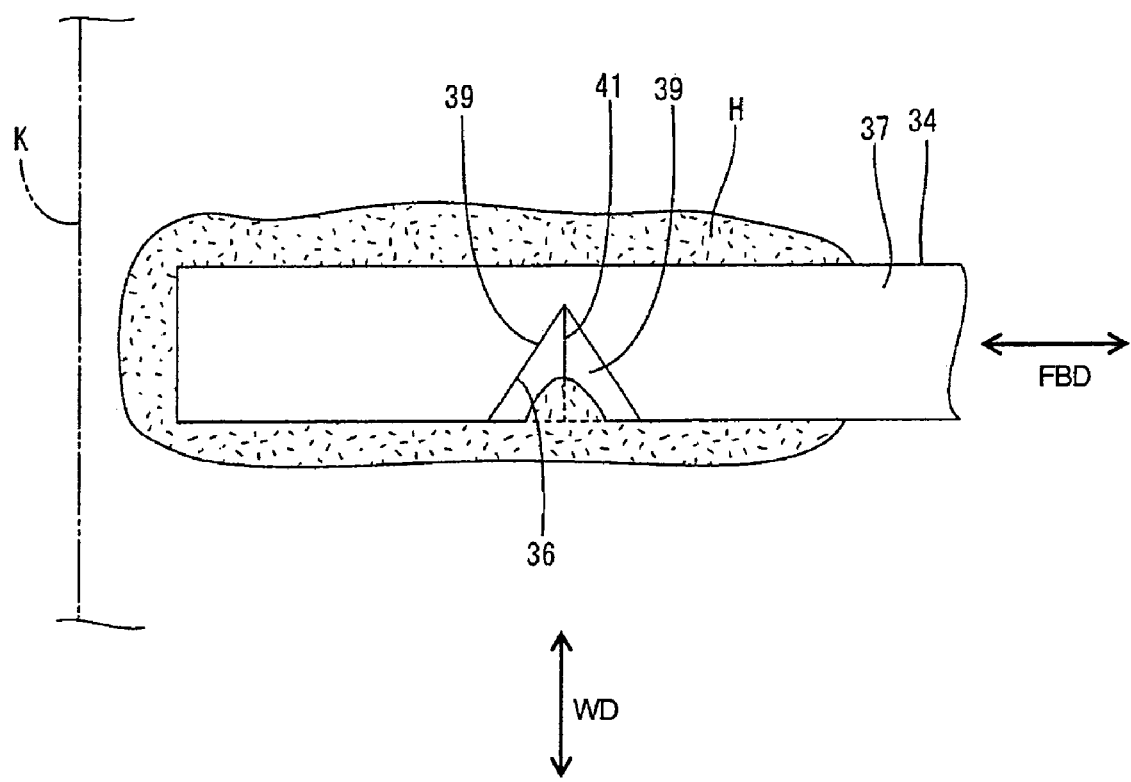
FIG. 5 is a plan view of the board connecting portion having the solder adhered thereto.

The fixing portions 20 then are mounted into the housing 10 and can be fixed to the circuit board K by soldering. The respective terminal fittings 30 also are connected to the circuit board K. More particularly, the board connecting portions 34 of the terminal fittings 30 are placed on the corresponding conductors on the circuit board K, and solder H is adhered to the peripheral edges of the board connecting portions 34. Part of the solder H enters the notches 36 and flows up along the sloped surfaces 39 of the notches 36 to a specified height, as shown in FIG. 5. The adhered solder H then solidifies to fix the board connecting portions 34 to the circuit board K while achieving electrical connection with the conductors. The fixing portions 20 may be fixed to the circuit board K before, after or simultaneously with the soldered connection of the terminal fittings 30. Additionally, soldering may be carried out by manual soldering or reflow soldering.

The adequacy of the soldered connection of the board connecting portions 34 then is tested. The test is conducted by eye or by camera from above to determine whether the solder H has reached a specified height in the notches 36 of the board connecting portions 34, as shown in FIG. 5. The view of a tester is not blocked by adjacent board connecting portions 34 or by the housing 10. Thus, a good testing condition is ensured. It should be noted that the specified solder height is set to pass a quality control test relating to a proper amount of solder, and is at intermediate positions on the sloped surfaces 39 of the notches 36 or at the upper ends of the sloped surfaces 39.

The amount of solder H is judged to be proper by the test if the height of the upper surface of the solder H on the sloped surfaces 39 is detected to be the same as or higher than the specified solder height. On the other hand, the amount of solder is judged to be improper if the height of the upper surface of the solder H on the sloped surfaces 39 is detected to be lower than the specified solder height. The bottoms of the sloped surfaces 39 of the notches 36 reach the lower surfaces of the board connecting portions 34. Thus, there is no likelihood that the solder H will adhere to the sloped surfaces 39 if soldering is not applied. The reliability of the test is improved by the plating applied to the sloped surfaces 39 of the notches 36. Conversely, the rear end surfaces 44 of the board connecting portions 34 are unplated and cannot function well as testing surfaces.

Figure 7A:
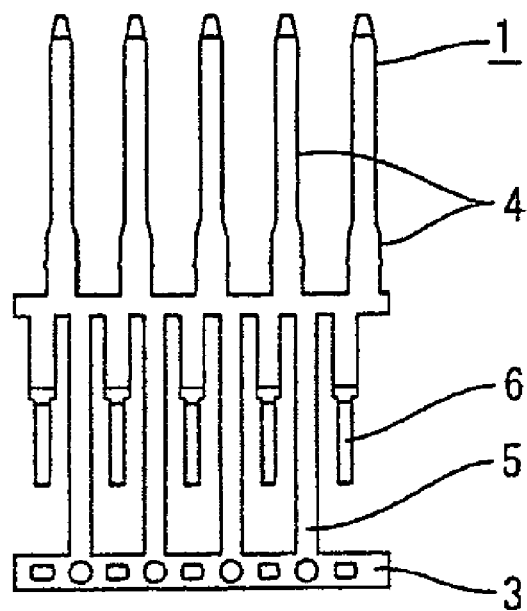
FIG. 7(A) is a plan view of conventional chained terminals and FIG. 7(B) is a plan view of other conventional chained terminals.
Figure 7B:
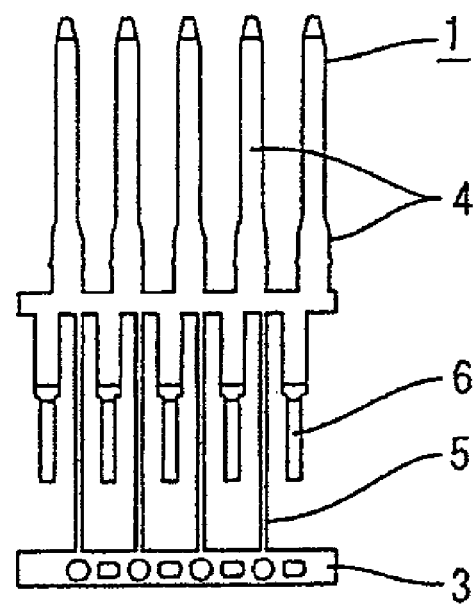
Figure 8:
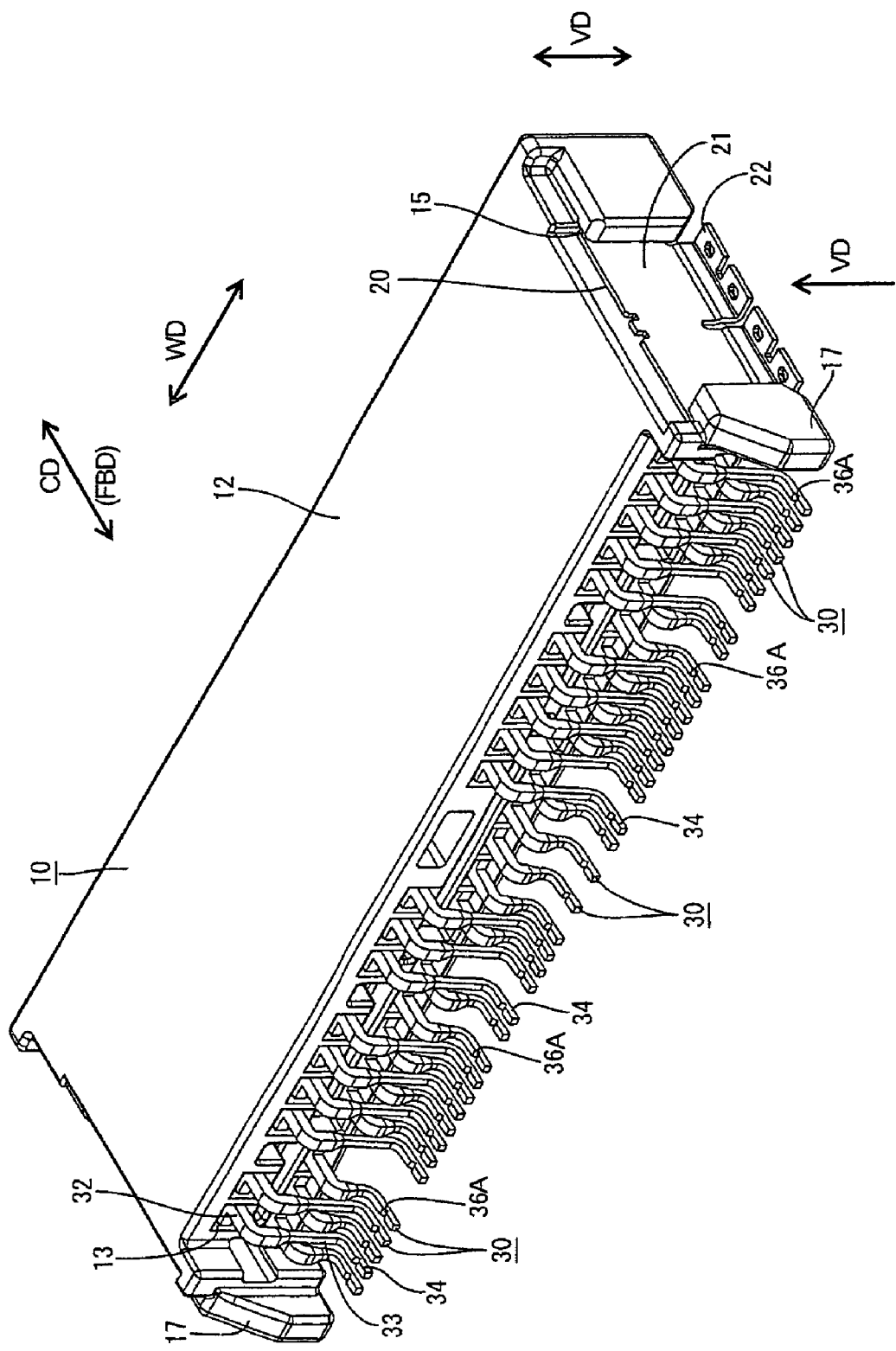
FIG. 8 is a perspective view of a circuit board connector according to a second embodiment.
Figure 9:
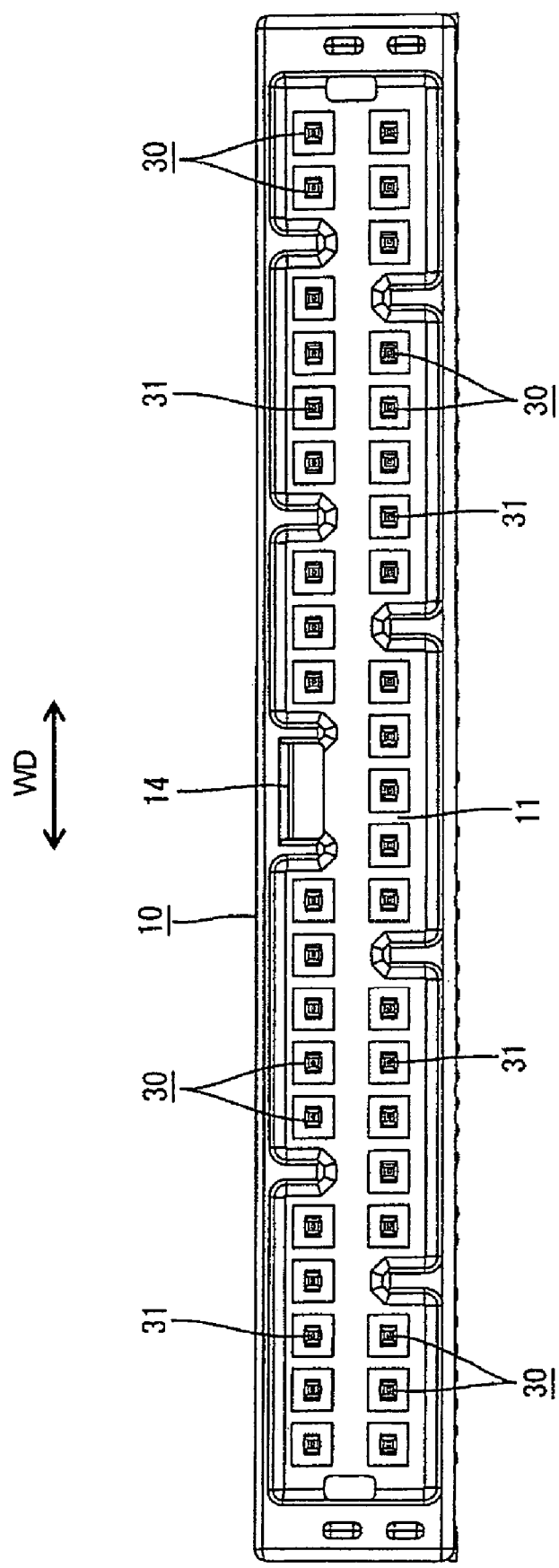
FIG. 9 is a front view of the circuit board connector.
Figure 10:
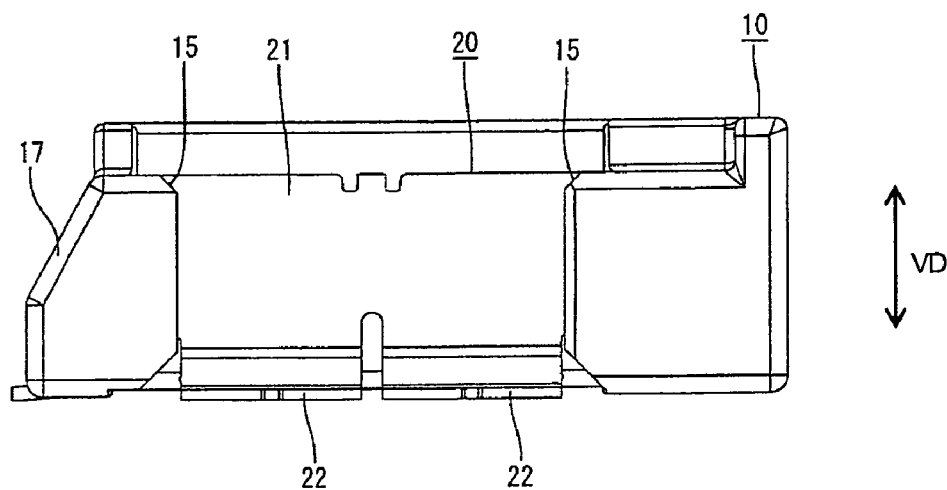
FIG. 10 is a side view of the circuit board connector.

As described above, the rear end surfaces 44 of the board connecting portions 34 can be unplated because the solder test uses the notches 36 formed in the lateral edges of the board connecting portions 34. Thus, unlike the prior art of FIG. 7, there is no need to provide the couplings 52 and the board connecting portions 34 adjacent to one another in an alternating array. As a result, the terminals fittings 30 are punched out at narrower intervals along the metal sheet to achieve miniaturization and lower cost.

The bottom edges of the sloped surfaces 39 of the notches 36 reach the lower surfaces of the board connecting portions 34. Thus, a contact area of the solder H and the sloped surfaces 39 is large and the board connecting portions 34 are fixed securely to the circuit board K. Further, solder H will not adhere to the bottom edges of the slants 39 unless plating is applied. Thus the presence of plating can be determined during the test.

A second embodiment of the invention is described with reference to FIGS. 8 to 13. The second embodiment differs from the first embodiment in the configuration of the recess. Features of the second embodiment that are the same as or similar to the first embodiment are not described again and merely are identified by the same reference numerals.

Figure 11:
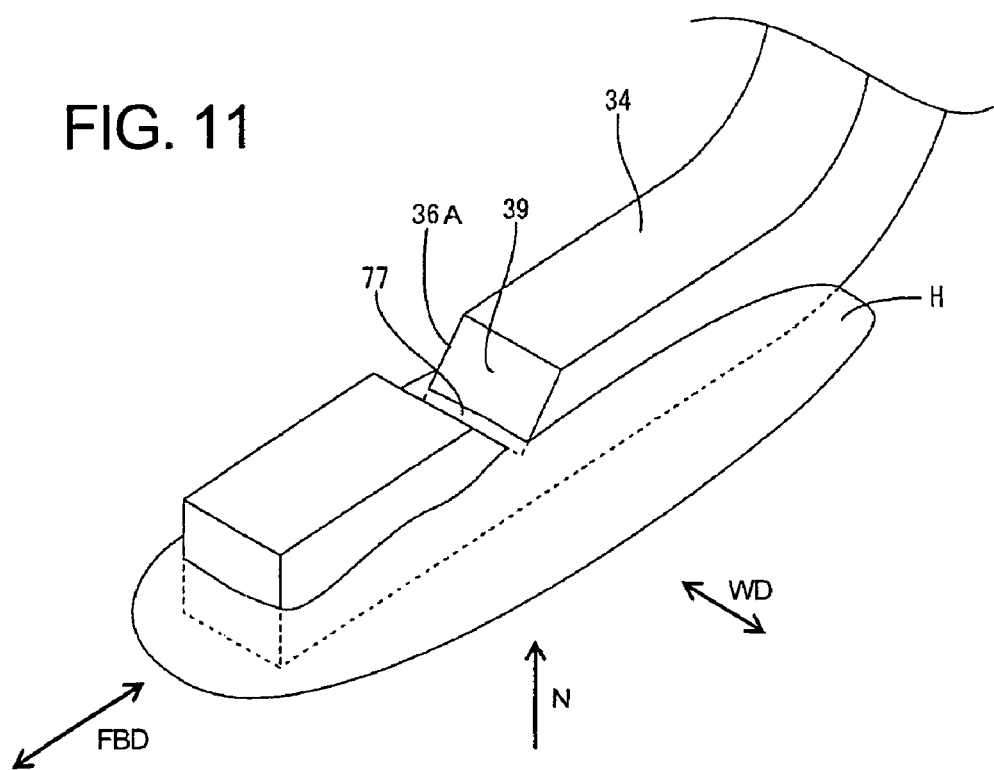
FIG. 11 is an enlarged perspective view of a board connecting portion having solder adhered thereto.

As shown in FIG. 11, a recess 36A is formed in the upper surface of each board connecting portion 34 of each terminal fitting 30. The recess 36A is formed by striking the upper surface of the board connecting portion 34 from above to make a notch that extends continuously across the upper surface of the board connecting portion 34. The recess 36A has sloped surfaces 39A that meet at a cut-in line 41A extending substantially in width direction WD. The sloped surfaces 39A form a substantially V-shape that gradually widens at farther distances from the cut-in line 41A. The cut-in line 41A is substantially normal to the normal vector N of the circuit board surface. Moreover, the sloped surfaces 39A are arranged at an angle in the range of about 20° to 60° to the normal vector N of the circuit board surface. The depth of each recess 36A measured as the vertical distance between the upper surface of the board connecting portion 34 and the cut-in line 41A is more than about one third, preferably at least about half the height of the board connecting portions 34. Additionally, the recesses 36A are substantially identically shaped and are at substantially the same positions of the board connecting portions 34 with respect to forward and backward directions FBD. Thus, the cut-in lines 41A are aligned on a substantially straight line in width direction WD.

Solder H applied to the conductors can flow into the recesses 36A and along the sloped surfaces 39A. The solder H adheres to the sloped surfaces 39A continuously between the opposite side surfaces of the board connecting portions 34 to form a bridge 77. The bridges 77 function as hooks for preventing upward displacements of the board connecting portions 34 away from the printed circuit board K. The outer surfaces of the board connecting portions 34 adjacent to the recesses 36A also are covered by the solder H for strong retention on the conductors 60.

Figure 12:
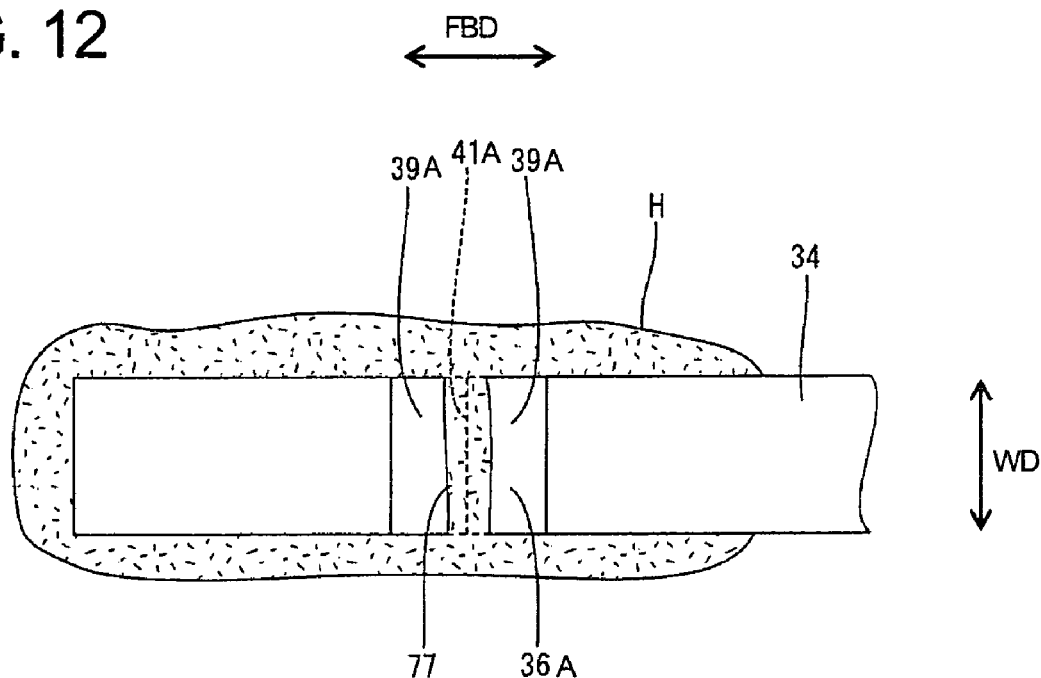
FIG. 12 is an enlarged plan view of the board connecting portion having the solder adhered thereto.
Figure 13:
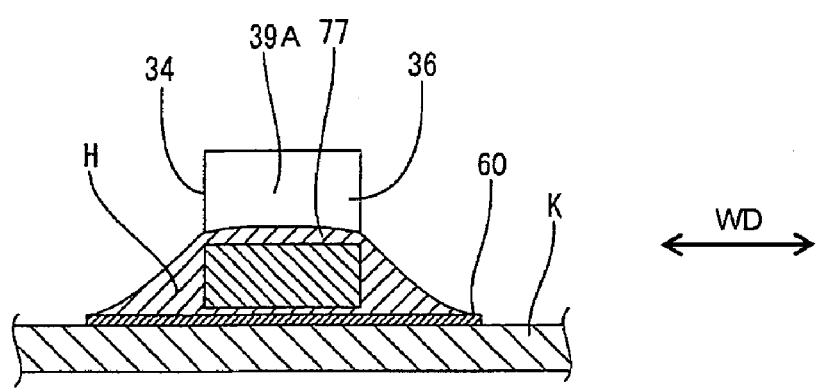
FIG. 13 is an enlarged section showing the solder in a recess.

The terminal fittings 30 are inserted through the terminal insertion holes 13 of the housing 10. The fixing portions 20 also are mounted into the housing 10 and are soldered to the circuit board K for fixing the housing 10 to the circuit board K. Simultaneously or successively, the terminal fittings 30 are soldered. More specifically, the board connecting portions 34 of the terminal fittings 30 are placed on the corresponding conductors 60 on the circuit board K. Then, as shown in FIGS. 11 and 12, the solder H is adhered from the opposite side surfaces to the rear end surfaces of the board connecting portions 34 and flows in the width direction WD in the recesses 36A substantially between the opposite side surfaces of the connecting portions 34.

The solder H then solidifies and forms the bridges 77 between the opposite side surfaces of the board connecting portions 34. Thus, the board connecting portions 34 are fixed to the circuit board K and are connected electrically with the conductors 60. It should be noted that the fixing portions 20 may be soldered to the circuit board K before, after or simultaneously with the soldering of the terminal fittings 30. Additionally, the soldering may be manual soldering or reflow soldering.

As described above, the recesses 36A are formed in the upper surfaces of the board connecting portions 34 and the solder H applied to the conductors 60 flows into these recesses 36A and solidifies. As a result, the board connecting portions 34 are held securely on the circuit board K. Accordingly, the board connecting portions 34 are retained by the solder H in the recesses 36A and can resist a tensile force acting on the board connecting portions 34 in an upward direction away from the circuit board K. More particularly, the bridges 77 extend from one lateral side of each board connecting portion 34 to the other to achieve a strong retaining force. Thus, the board connecting portions 34 are secured reliably to the conductors 60 and will not detach.

The recesses 36A can be processed easily by striking the upper surfaces of the board connecting portions 34.

The invention is not limited to the above described embodiments. For example, the following embodiments also are embraced by the invention as defined by the claims. Beside the following embodiments, other changes can be made without departing from the scope of the invention defined by the claims.

The solder testing portions are notches in the illustrated embodiments. However, the solder testing portions can have any sloped surface that can be seen from the outside. For example, the board connecting portion may have a trapezoidal cross section that is narrower at the top.

In the present invention, the sloped surfaces of the solder testing portions may be colored in a color to have a clear contrast with the solder.

The terminal fittings need not be L-shaped and may, for example, be straight from the terminal connecting portions to the board connecting portions.

The terminal fittings may be insert molded in the housing.

It is not necessary to fix the housing to the circuit board using the fixing portions. For example, the housing may be fixed by screws.

The recesses 36, 36A need not be V-shaped cuts and, for example, may be substantially box-shaped with substantially horizontal and vertical walls.

The notches may be on both sides of the board connecting portion.

The invention is also applicable to connectors fixed to electric or electronic devices other than printed circuit boards, such as junction boxes, dashboard panels, fuse boxes, relay boxes or the like.

What is claimed is:

1. A connector for an electric or electronic device having at least one substantially planar mounting surface, comprising:

a housing to be fixed to the device; and at least one terminal fitting to be mounted in the housing, said terminal fitting including a device connecting portion to be drawn out of the housing, the device connecting portion having a lower surface to be arranged on the planar mounting surface of the device and to be connected with a corresponding conductor on the device by soldering, and at least one recess formed in the device connecting portion for receiving a flow of solder applied to the conductors the recess comprising two substantially symmetric sloped surfaces.

2. The connector of claim 1, wherein the recess is formed at a corner of the device connecting portion spaced from the lower surface thereof.

3. The connector of claim 1, wherein the sloped surfaces of the recess intersect at a cut-in line extending obliquely to a normal vector of the surface of the device, the sloped surfaces being sloped up along directions away from the cut-in line.

4. The connector of claim 1, wherein the recess is provided on an upper surface of the device connecting portion substantially opposite to the lower surface.

5. The connector of claim 4, wherein the recess extends across the upper surface of the device connecting portion and opens in side surfaces at the substantially opposite sides of the upper surface.

6. The connector of claim 1, wherein the recess has at least one upwardly sloped surface extending to a lateral side of the device connecting portion, a height of the upper surface of the solder being within a height range of the sloped surface, and an adhered state of the solder to the sloped surface being visible from outside housing.

7. The connector of claim 6, wherein the recess is formed by striking at least one oblique notch in at least one lateral edge of the device connecting portions, and an inner surface of the notch defining the sloped surfaces.

8. The connector of claim 6, wherein a bottom of the sloped surface in the recess extends substantially up to the lower surfaces of the device connecting portion.

9. A connector for an electric or electronic device, comprising:
   a housing to be fixed to the device; and
   at least one terminal fitting to be mounted in the housing, each terminal fitting including a device connecting portion to be drawn out of the housing, the device connecting portion having a lower surface to be arranged on the device and to be connected with a corresponding conductor on the device by soldering, and at least one recess formed in the device connecting portion for receiving a flow of solder applied to the conductors, the recess having at least one upwardly sloped surface extending to a lateral side of the device connecting portion, a height of the upper surface of the solder being within a height range of the sloped surface, and an adhered state of the solder to the sloped surface being visible from outside housing, wherein sloped surface of the recess is colored in a color having a contrast with the solder.

10. A terminal fitting for a connector to be mounted on an electric or electronic device, the terminal fitting comprising a terminal connecting portion for mounting in the connector and a device connecting portion having a cut end remote from the terminal connecting portion, the terminal fitting having a plating thereon at locations spaced from the cut end, the device connecting portion having a lower surface extending from the cut end towards the terminal connecting portion, the lower surface being disposed to be arranged on a surface of the device and to be connected with a conductor on the device by solder, the device connecting portion further having an upper surface opposite the lower surface and side surfaces extending between the upper and lower surfaces, a recess being formed by striking the device connecting portion at a location spaced from the cut end for receiving a flow of solder applied to the conductors, the recess intersecting the upper surface and at least one of the side surfaces of the device connecting portion.

11. The terminal fitting of claim 10, wherein the recess has at least one sloped surface for receiving solder applied to the conductors is to be adhered.

12. The terminal fitting of claim 10, wherein the recess is substantially V-shaped.

13. The terminal fitting of claim 10, wherein the recess intersects both of said side surfaces of the device connecting portion.

14. The terminal fitting of claim 10, wherein the upper and lower surfaces and the side surfaces of the device connecting portion, including the recess are plated.

15. Chained terminals comprising a carrier and a plurality of terminal fittings projecting substantially side by side from at least one lateral edge of the carrier a V-shaped notch formed in each of said terminal fittings at a location spaced from the carrier and plating applied to the terminal fittings including the notches, whereby the terminal fittings can be cut from the carrier at locations between the V-shaped notches and the carrier.

16. A method for testing a soldered connection of a terminal fitting to an electric or electronic device, comprising the following steps:
   providing chained terminals having a carrier and a plurality of terminal fittings extending from the carrier, each of said terminal fittings having a device connecting portion with opposite upper and lower surfaces and opposite side surfaces, at least one recess intersecting the upper surface and at least one of said side surfaces, the recess having two upwardly sloped surfaces aligned at an acute angle to the lower surface of the terminal fitting;
   plating the terminal fittings, including the recesses;
   cutting the terminal fittings from the carrier at locations spaced from the recess and between the recesses and the carrier;
   arranging the device connecting portion on the device;
   soldering the device connecting portion to a conductor on the device so that solder flows into the recess; and
   inspecting from above a position of the solder on the sloped surfaces for determining an adhered state of the terminal fitting.

* * * * *